United States Patent
Shen et al.

(10) Patent No.: US 8,264,839 B2
(45) Date of Patent: Sep. 11, 2012

(54) PAD FOR PORTABLE ELECTRONICS

(75) Inventors: Hsin-Wei Shen, Taipei Hsien (TW);
Chih-Yi Wang, Taipei Hsien (TW);
Chen-Hung Lin, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 234 days.

(21) Appl. No.: 12/832,415

(22) Filed: Jul. 8, 2010

(65) Prior Publication Data
US 2011/0164356 A1 Jul. 7, 2011

(30) Foreign Application Priority Data

Jan. 5, 2010 (TW) ................................ 99100043 A (51) Int. Cl.
*G06F 1/16* (2006.01)
(52) U.S. Cl. ................................ 361/679.59; 248/188.8
(58) Field of Classification Search ............. 361/679.59; 174/50, 17 CT; 248/188.8
See application file for complete search history.

(56) References Cited

U.S. PATENT DOCUMENTS

| | | | | |
|---|---|---|---|---|
| 3,401,908 | A * | 9/1968 | Rapata ........................ | 248/188.8 |
| 3,426,986 | A * | 2/1969 | Pool ............................. | 248/616 |
| 5,169,115 | A * | 12/1992 | Chung Hsiang ............. | 248/677 |
| 6,097,592 | A * | 8/2000 | Seo et al. .................... | 361/679.55 |
| 6,979,778 | B2 * | 12/2005 | Xiong et al. ................ | 174/50 |
| 7,679,905 | B2 * | 3/2010 | Wu et al. .................... | 361/679.59 |
| 7,697,283 | B2 * | 4/2010 | Mathew et al. ............. | 361/679.59 |
| 7,715,190 | B2 * | 5/2010 | Tang ........................... | 361/679.55 |
| 7,746,636 | B2 * | 6/2010 | Tang ........................... | 361/679.55 |
| 7,817,418 | B2 * | 10/2010 | Bailey ......................... | 361/679.59 |
| 7,855,883 | B2 * | 12/2010 | Tang ........................... | 361/679.55 |
| 7,898,802 | B2 * | 3/2011 | Lian ............................ | 361/679.59 |
| 7,986,525 | B2 * | 7/2011 | Wang .......................... | 361/679.59 |
| 7,990,703 | B2 * | 8/2011 | Tang ........................... | 361/679.59 |
| 8,050,032 | B2 * | 11/2011 | Trang .......................... | 361/679.59 |
| 8,109,486 | B2 * | 2/2012 | Gong et al. .................. | 248/615 |
| 8,154,860 | B2 * | 4/2012 | Chen ........................... | 361/679.01 |
| 2004/0025993 | A1 * | 2/2004 | Russell ........................ | 150/154 |
| 2008/0251663 | A1 * | 10/2008 | Tracy et al. ................. | 248/188.8 |
| 2011/0042118 | A1 * | 2/2011 | Fan ............................. | 174/50 |
| 2011/0058315 | A1 * | 3/2011 | Liu et al. .................... | 361/679.01 |
| 2011/0310536 | A1 * | 12/2011 | Uttermann et al. ......... | 361/679.01 |

FOREIGN PATENT DOCUMENTS

TW M285177 U 1/2006

OTHER PUBLICATIONS

Communication from a foreign patent office in a counterpart foreign application dated Mar. 20, 2012.

* cited by examiner

*Primary Examiner* — Lisa Lea Edmonds
(74) *Attorney, Agent, or Firm* — Rosenberg, Klein & Lee (57) ABSTRACT

A pad for portable electronics mounted on a housing of portable electronics is revealed. The pad includes a lower fastener, a buffer member arranged above the lower fastener, an upper fastener connected with the buffer member and mounted onto the housing, and a gripping member disposed above the upper fastener. The housing is arranged with an insertion hole. The gripping member penetrates the insertion hole and clips to a side wall of the housing. Thus there is no need to arrange the pad by adhesives or thermal fusion. Moreover, the height of the pad disposed is adjusted automatically by the buffer member. Therefore, the convenience of use of the pad is increased.

17 Claims, 15 Drawing Sheets

PAD FOR PORTABLE ELECTRONICS

BACKGROUND OF THE INVENTION

1. Fields of the Invention

The present invention relates to a pad for electronics, especially to a pad for portable electronics.

2. Descriptions of Related Art

Along with development of modern technology, portable electronics such as notebooks, mobile phones, MPEG-1 Audio Layer 3 (MP3), personal digital assistant (PDA) etc. have become more popular. Most of portable electronics are arranged with pads for improving stability or friction resistance. However, general pads available on the market are assembled on the portable electronics by adhesives on back surfaces thereof or thermal fusion. A plurality of rubber or plastic pads is directly arranged under the portable electronics and the height of the pad is unable to be adjusted. No matter adhesion by adhesives or thermal fusion, the height of the pad can't be changed once the pad is assembled on the bottom of the portable electronics. Especially after the thermal fusion, it is impossible to reprocess. As to the adhesion by adhesives on back surfaces of pads, the problem of adhesive residue comes when we disassemble the pads. The removed pads that are originally connected with the portable electronics may be damaged or destroyed.

Take the notebook as an example, sometimes not all the pads on the notebook contact a desk surface or a placement surface uniformly at the same time. Especially when the notebook is set on a rough desk surface or an unsmooth placement surface, one of the pads is suspended and this leads to inconvenience in use.

Moreover, the pads attached to portable electronics by adhesives may be released from the electronics due to the loss of the adhesive strength caused by increasing of temperature or aging of the adhesive. The pads can't serve their function.

Thus there is a need to have pads for portable electronics that are disposed without adhesives or thermal fusion. Moreover, the pads make portable electronics set on the placement surface more stably so as to solve problems mentioned above.

SUMMARY OF THE INVENTION

Therefore it is a primary object of the present invention to provide a pad for portable electronics. The pad includes an upper fastener that is mounted on a housing of portable electronics by a gripping member, and a buffer member used to adjust the distance between the upper fastener and a lower fastener. By the gripping member, the pad is arranged at portable electronics without adhesives or thermal fusion. Moreover, the height of the pad is automatically adjusted by the buffer member. Thus the convenience of use of the pad is increased.

It is another object of the present invention to provide a pad for portable electronics that includes a gripping member with a holding plate. The height of the pad arranged is increased by the holding plate and users can choose the height of the pad to be arranged. Thus the convenience of use of the pad is enhanced.

In order to achieve above objects, the pad for portable electronics of the present invention is mounted on a housing of portable electronics. The pad consists of a lower fastener, at least one buffer member, an upper fastener and at least one gripping member. The buffer member is arranged above the lower fastener. The upper fastener is connected with the buffer member and is mounted into the housing. The gripping member is disposed above the upper fastener while the housing is arranged with an insertion hole. Thus the gripping member penetrates the insertion hole and clips to a side wall of the housing. By means of the gripping member, there is no need to arrange the pad by adhesives or thermal fusion. Moreover, the height of the pad arranged is automatically adjusted by the buffer member. Thus the convenience of use of the pad is improved.

Moreover, the pad of the present invention further includes a holding plate that is arranged above a connection part. The height of the pad is increased by means of the holding plate so that users can choose the height of the pad they intend to set. Thus the convenience of use of the pad is further enhanced.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Refer from FIG. 1A to FIG. 2B, different views of an embodiment according the present invention are revealed. As shown in figures, a pad of the present invention is mounted on a housing 10 of portable electronics. The pad includes a lower fastener 20, at least one buffer member 30, an upper fastener 40 and at least one gripping member 50. The buffer member 30 is disposed above the lower fastener 20 while the upper fastener 40 is connected with the buffer member 30 and is mounted to the housing 10. The gripping member 50 is arranged on the upper fastener 40 and the housing 10 is disposed with an insertion hole 12. The gripping member 50 penetrates the insertion hole 12 and clips to a side wall of the housing 10. With the gripping member 50, there is no need to mount the upper fastener 40 to the housing 10 by glues or thermal bonding. The pad is mounted onto the housing 10. In use of portable electronics, the lower fastener 20 contacts with a placement surface and the distance between the upper fastener 40 and the lower fastener 20 is automatically adjusted by the buffer member 30. That means the distance between the pad and the placement surface is adjusted automatically. Thus the convenience of use of the pad is improved.

For user's convenience to mount the upper fastener 40 to the housing 10, the housing 10 is arranged with a receiving slot 14. The insertion hole 12 is arranged inside the receiving slot 14 so that the user can mount the upper fastener 40 in the receiving slot 14. The lower fastener 20 is made of rubber that increases the friction between the lower fastener 20 and the placement surface. Therefore, the portable electronic is placed on the placement surface more stably.

Figure 1A:
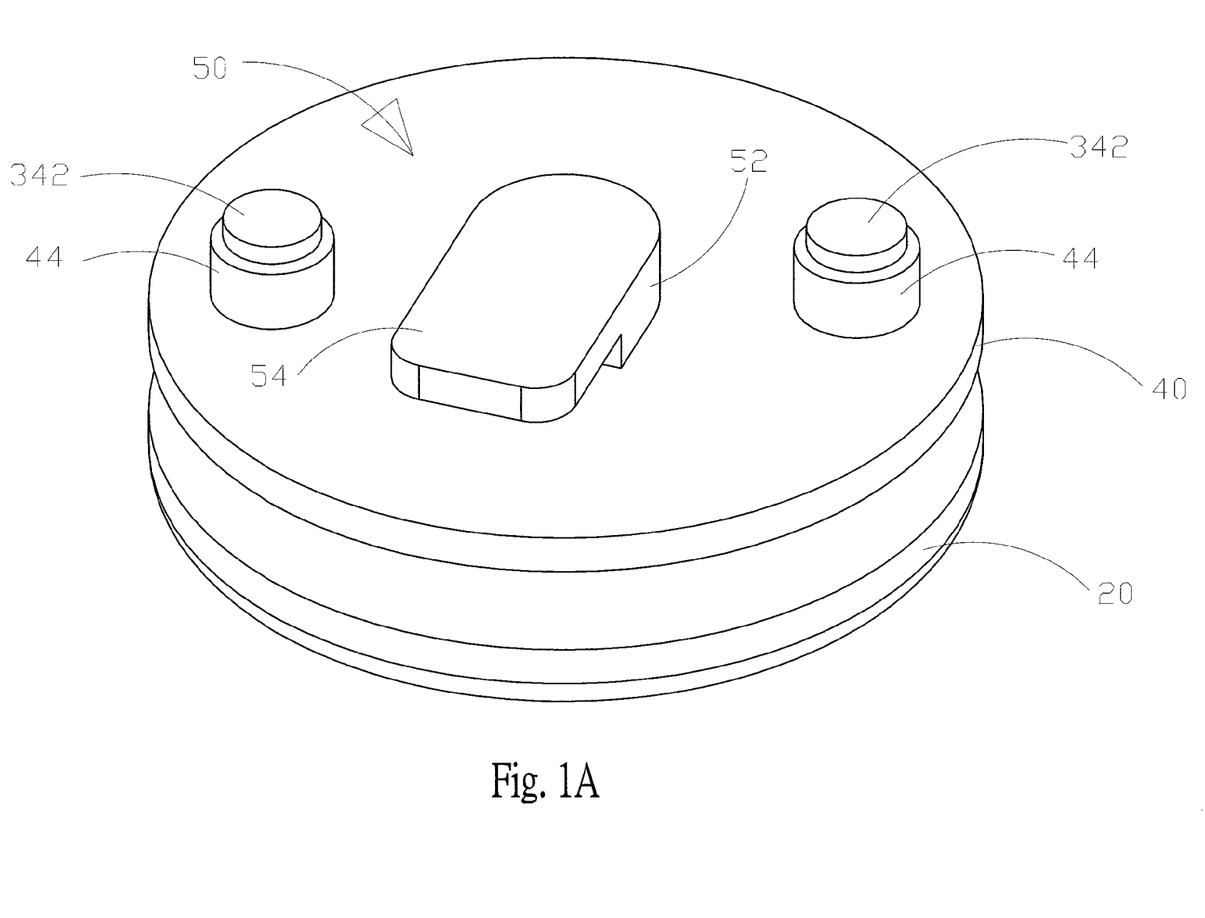
FIG. 1A is a perspective view of an embodiment of a pad for portable electronics according to the present invention.
Figure 1B:
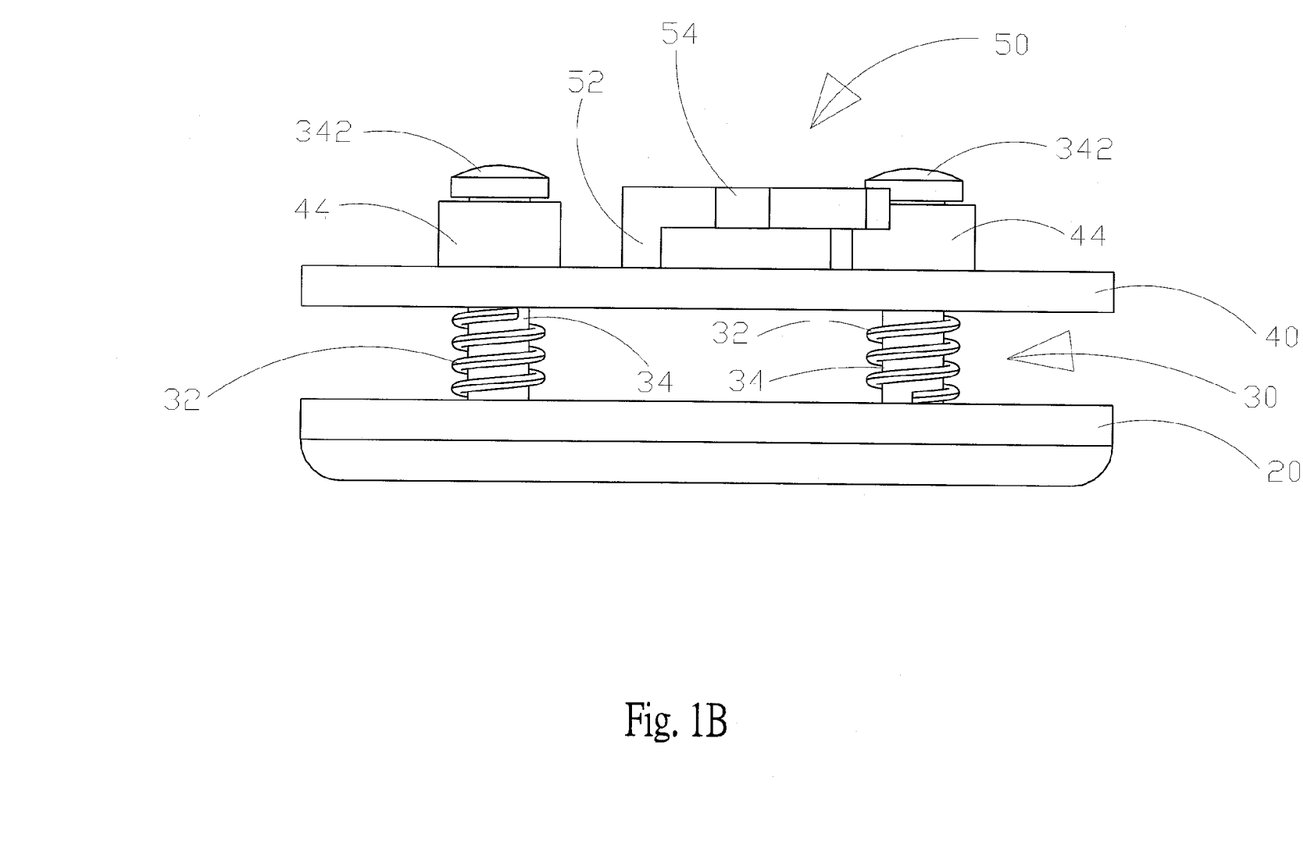
FIG. 1B is a front view of an embodiment of a pad for portable electronics according to the present invention.
Figure 1C:
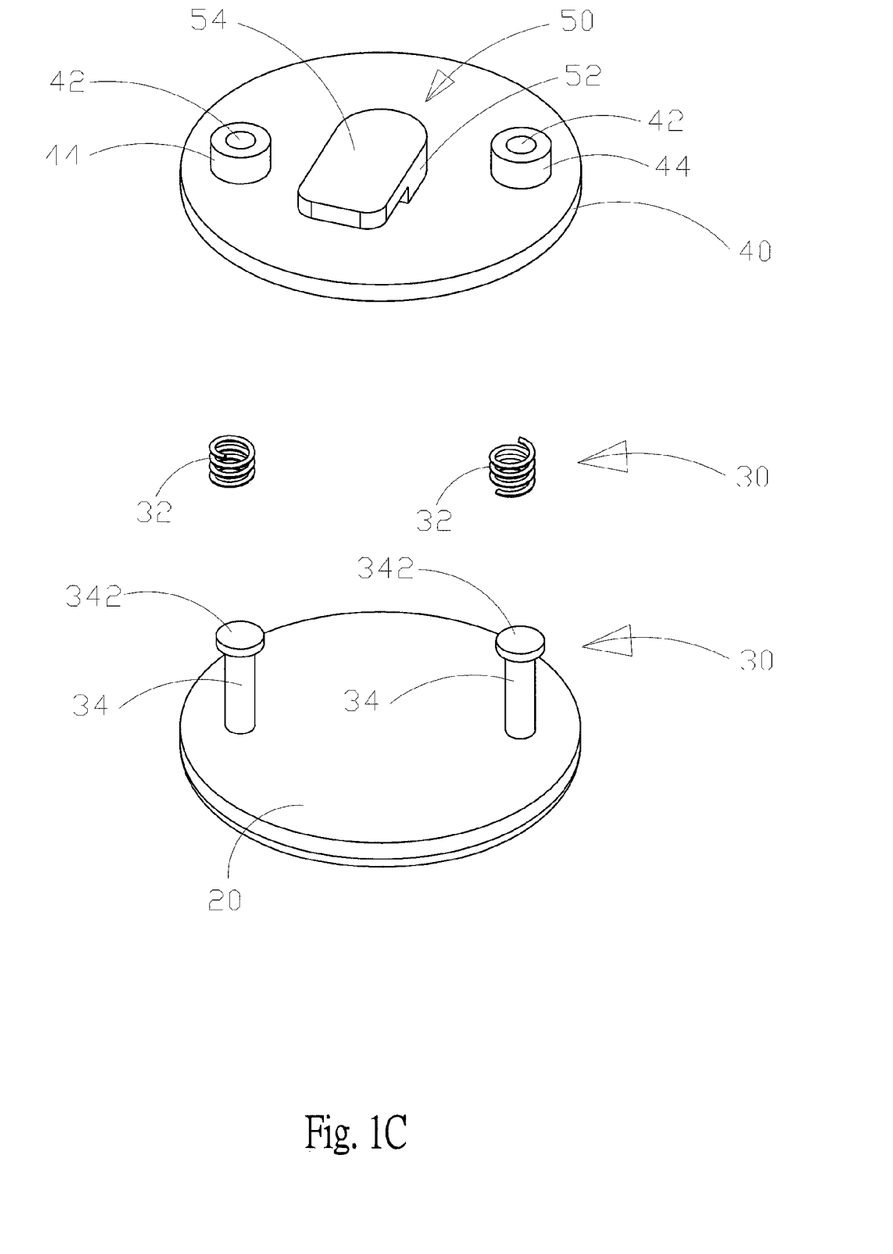
FIG. 1C is an explosive view of an embodiment of a pad for portable electronics according to the present invention.
Figure 2A:
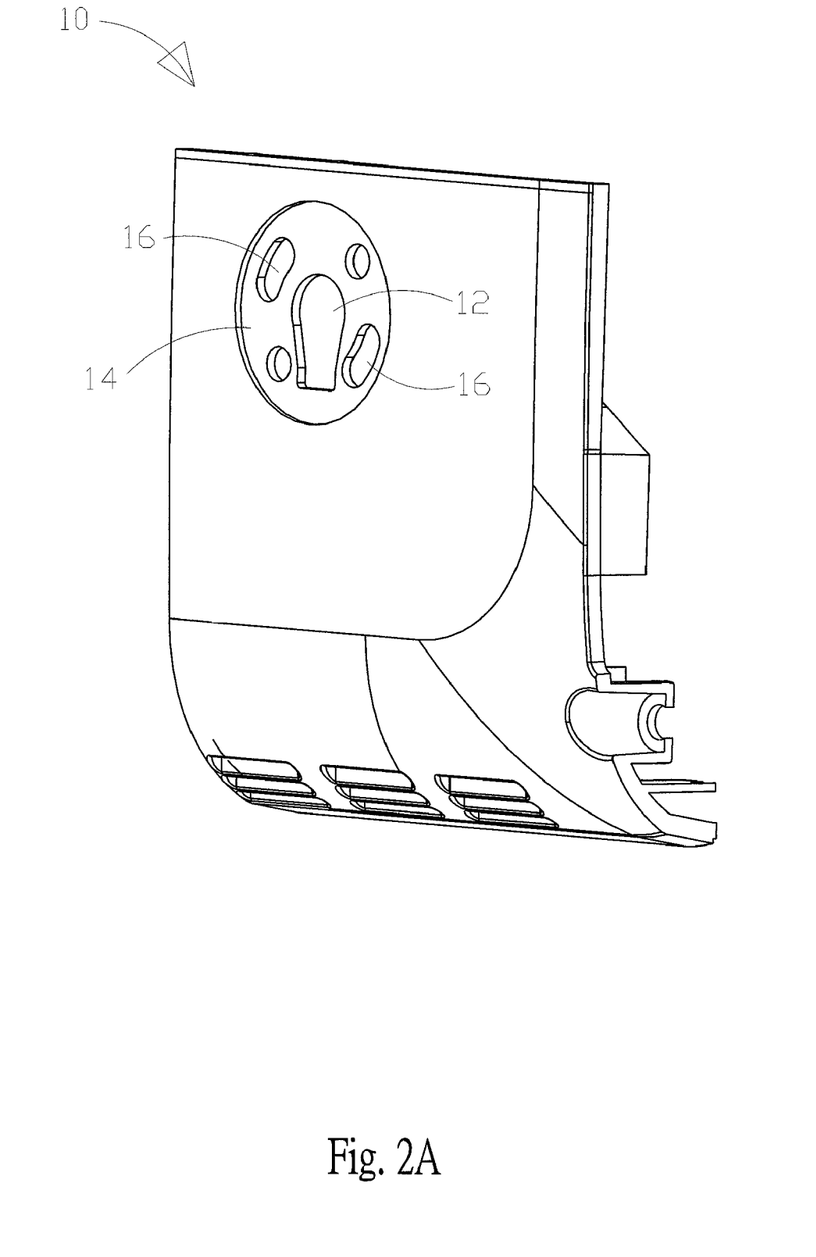
FIG. 2A is a partial view of a housing of a portable electronic with an embodiment according to the present invention.
Figure 2B:
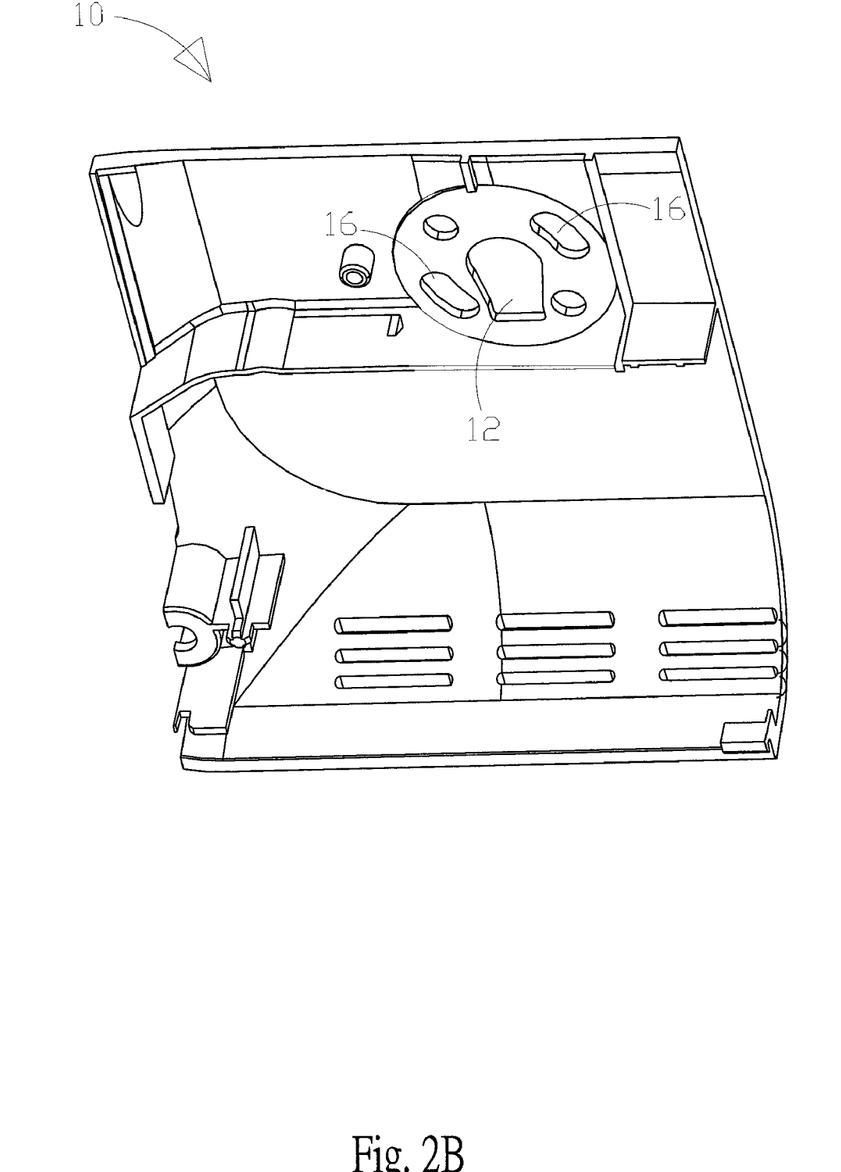
FIG. 2B is a partial view of a housing of a portable electronic with an embodiment according to the present invention.

The buffer member 30 of the present invention consists of a spring 32 whose two ends are respectively disposed under the upper fastener 40 and above the lower fastener 20. The distance between the upper fastener 40 and the lower fastener 20 can be adjusted by means of the spring 32. In this embodiment, there are two buffer members 30. The number of the buffer member 30 is adjustable according to users' different needs. Moreover, in order to improve stability of the buffer member 30 so as to make relative movement between the upper fastener 40 and the lower fastener 20 become more stable, the buffer member 30 further includes a fixing bar 34, inserted in the upper fastener 40 and fixed on the lower fastener 20. The spring is disposed around the fixing bar 34 and located between the upper fastener 40 and the lower fastener 20. Thus when the upper fastener 40 and the lower fastener 20 are moved relative to each other, the direction of the relative movement between the upper fastener 40 and the lower fastener 20 is limited by the fixing bar 34. For easy assembly of the fixing bar 34 with the upper fastener 40, the upper fastener 40 is arranged with a hole 42 so that the fixing bar 34 inserts into the hole 42. Moreover, the fixing bar 34 is arranged with a stopper 342 that is located over the upper fastener 40. The stopper 342 is used to prevent the fixing bar 34 from dropping out of the upper fastener 40.

The gripping member 50 consists of a connection part 52 and a clipping part 54. The connection part 52 is disposed on the upper fastener 40 while the clipping part 54 is arranged at one side of the connection part 52. The connection part 52 can be integrated with the upper fastener 40 and so can the connection part 52 with the clipping part 54. There is a certain distance between the clipping part 54 and the upper fastener 40. Thus after the gripping member 50 penetrating the insertion hole 12 and the upper fastener 40 being rotated, the housing 10 of portable electronics is mounted between the clipping part 54 and the upper fastener 40 and the upper fastener 40 is fixed on the housing 10. Moreover, for user's convenience to fix the upper fastener 40 on the housing 10, the upper fastener 40 is arranged with at least one stopper 44 thereabove while the housing 10 is arranged with a stop slot 16. The hole 42 penetrates the stopper 44 and the stopper 44 is mounted into the stop slot 16. Thus when the user rotates the upper fastener 40, the rotation angle of the upper fastener 40 is limited due to the assembly between the stopper 44 and the stop slot 16. Therefore, users can make sure that whether the upper fastener 40 is properly engaged.

Figure 3A:
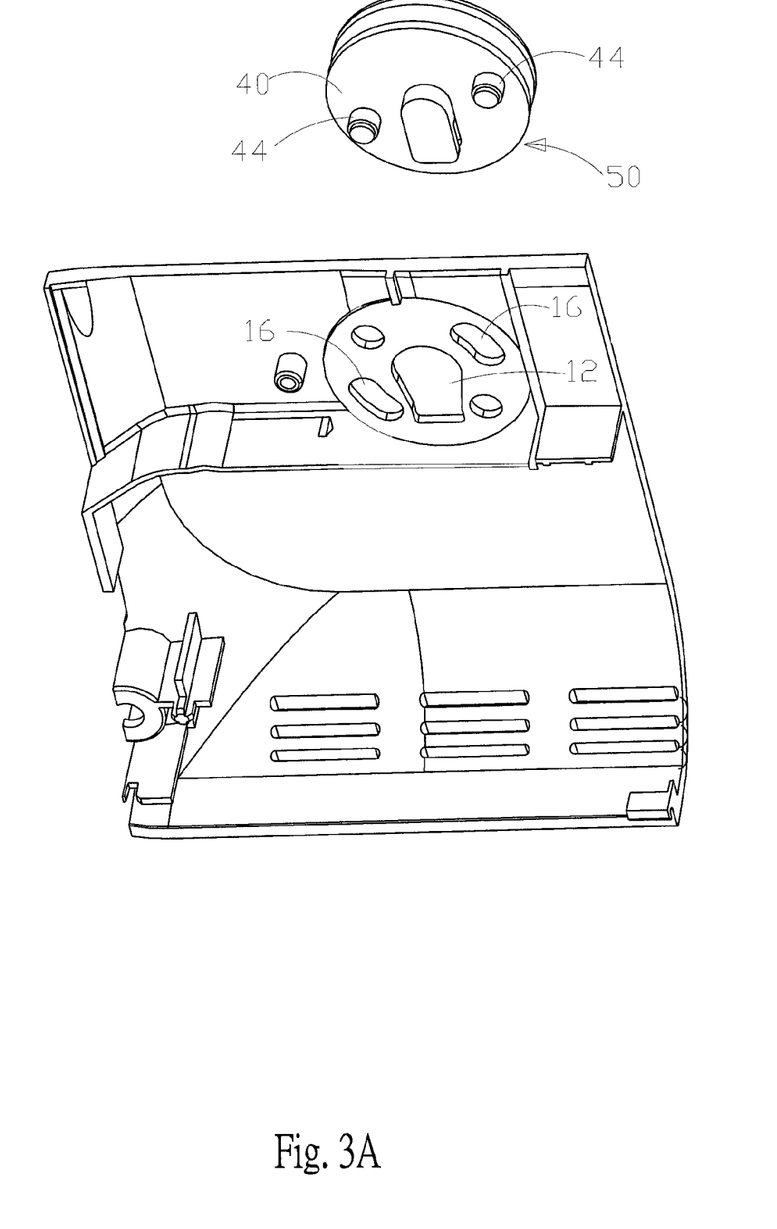
FIG. 3A to FIG. 3C are schematic drawings showing how an embodiment of a pad for portable electronics is assembled to a housing of a portable electronic according to the present invention.
Figure 3B:
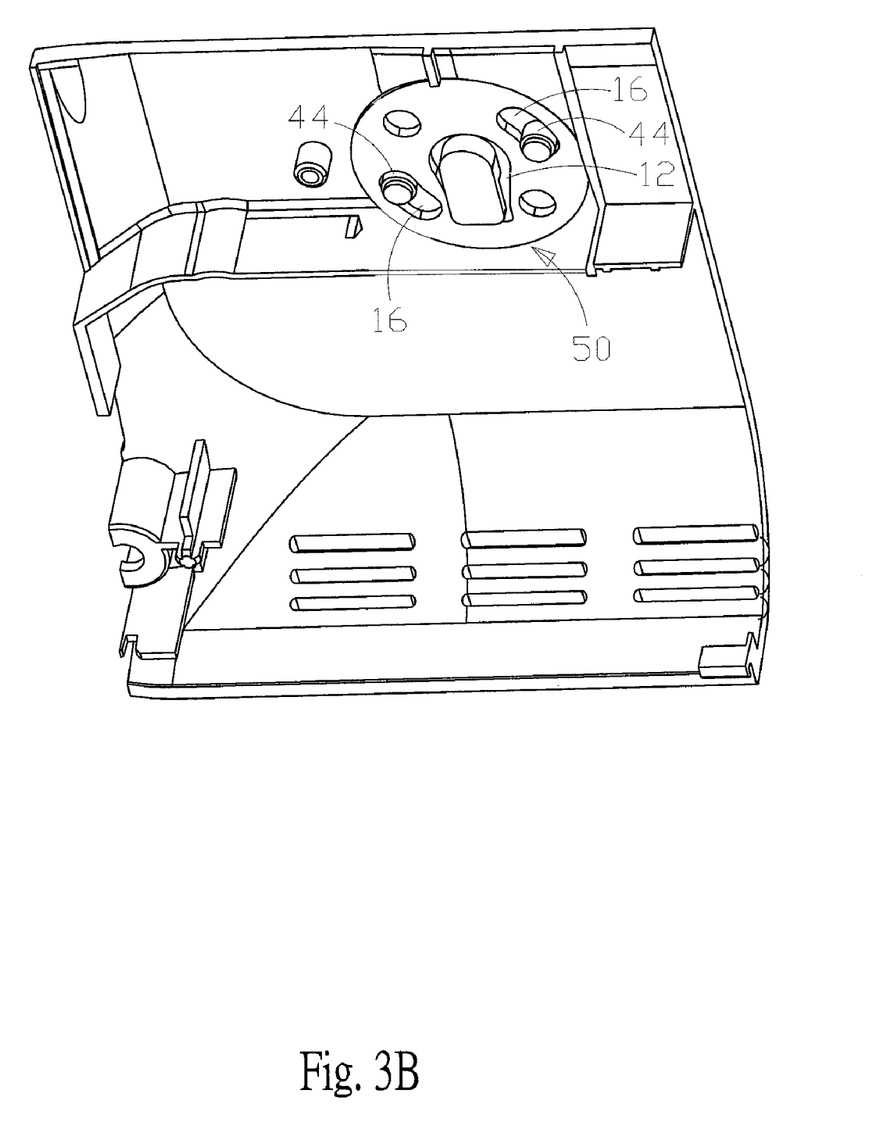
Figure 3C:
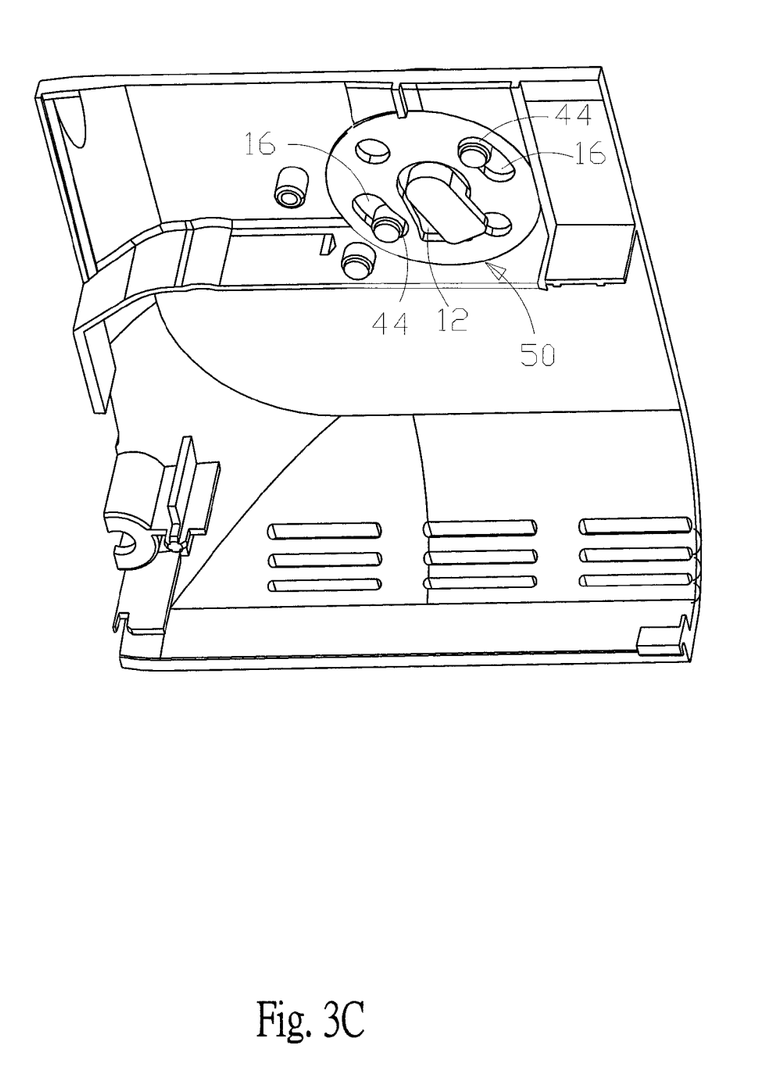

Refer from FIG. 3A to FIG. 3C, how an embodiment of a pad for portable electronics is assembled to a housing 10 of a portable electronic is revealed. As show in FIG. 3A, while mounting the pad of the present invention on the housing 10, the gripping member 50 is set corresponding to the insertion hole 12 of the housing 10 and the upper fastener 40 is arranged in the receiving slot 14. The stopper 44 is also located in the stop slot 16, as shown in FIG. 3B. Next rotate the upper fastener 40 so that the side wall of the housing 10 around the insertion hole 12 is mounted between the gripping member 50 and the upper fastener 40. Moreover, the stopper 44 inside the stop slot 16 slides from one end of the stop slot 16 to the other end of the stop slot 16. Thus the pad is arranged firmly on the housing 10.

Figure 4A:
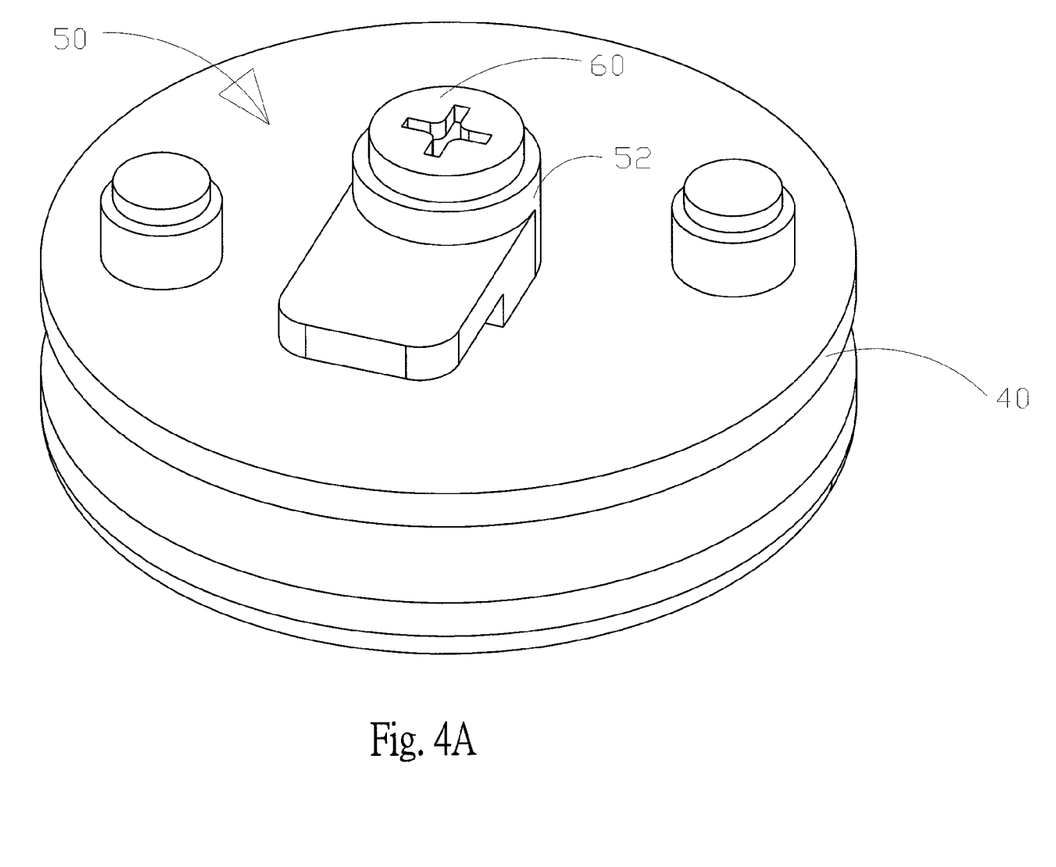
FIG. 4A is a perspective view of another embodiment of a pad for portable electronics according to the present invention.
Figure 4B:
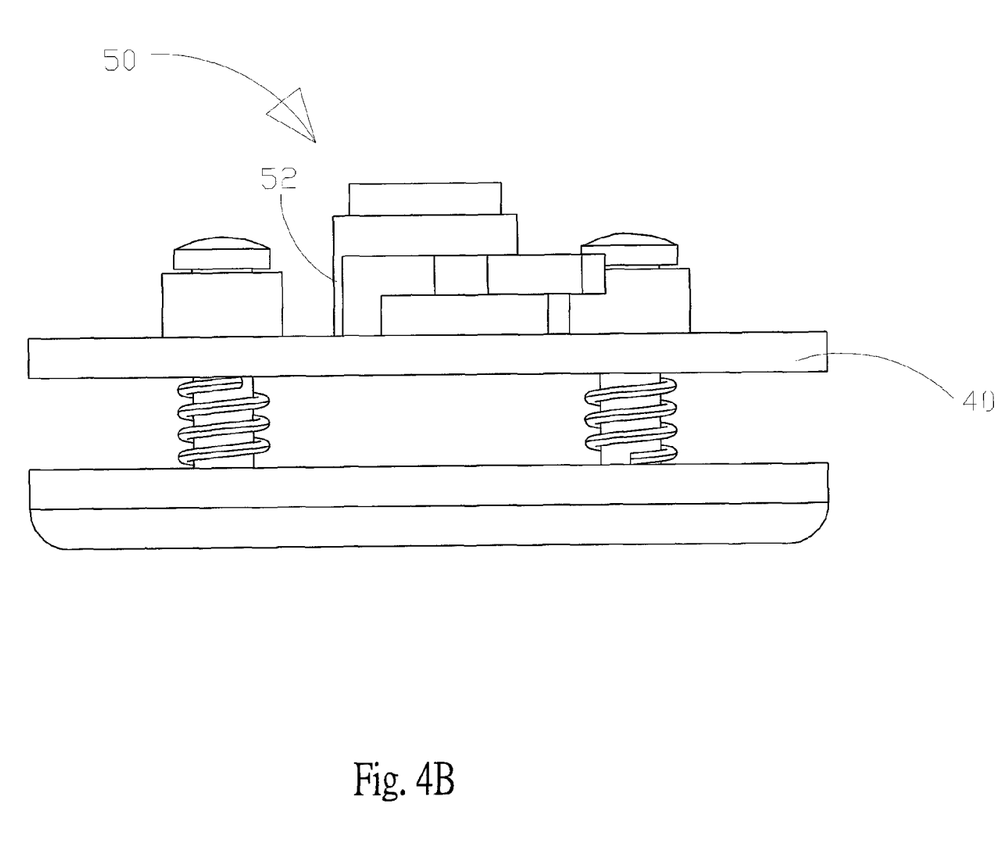
FIG. 4B is a front view of another embodiment of a pad for portable electronics according to the present invention.
Figure 4C:
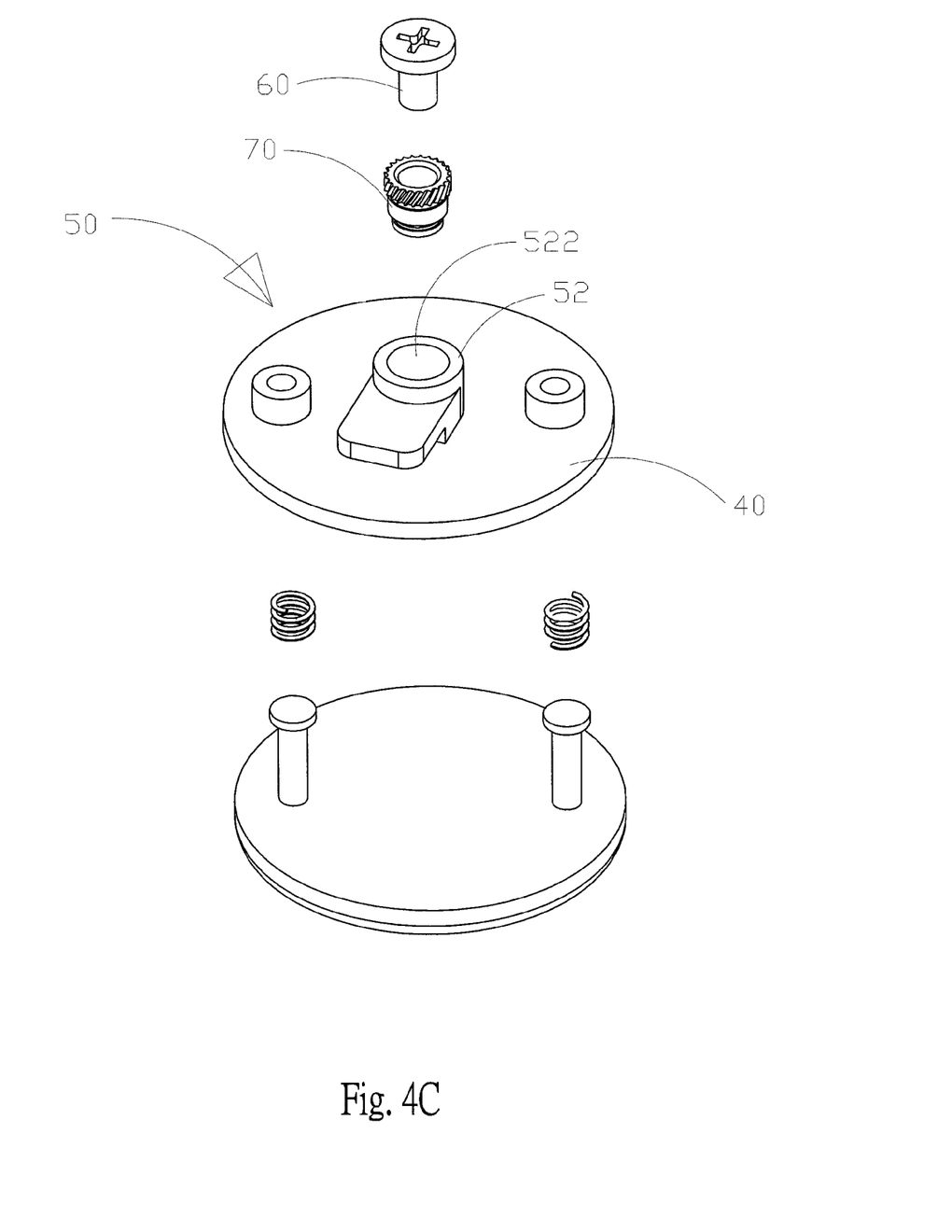
FIG. 4C is an explosive view of another embodiment of a pad for portable electronics according to the present invention.

Furthermore, refer from FIG. 4A to FIG. 4C, another embodiment of the present invention is disclosed. As shown in figures, the difference between this embodiment and the one in FIG. 1A is in that: the gripping member 50 is disposed on the upper fastener 40 in a different way. In this embodiment, the gripping member 50 is fastened to the upper fastener 40. The pad of the present invention further includes a locking element 60 while the connection part 52 of the gripping member 50 is arranged with a locking hole 522. The locking element 60 is inserted into the locking hole 522 and is fixed on the upper fastener 40. In order to fasten the locking element 60 to the gripping member 50 more firmly and prevent the locking hole 522 from deforming or damaging while being assembled with the locking element 60, this embodiment further consists of a locking seat 70 arranged in the locking hole 522. The locking element 60 is mounted into the locking seat 70. Thus the gripping member 50 is fastened on the upper fastener 40 more tightly by the locking seat 70. This makes the replacement of the worn and damaged gripping member 50 become more convenient and easier for users.

Figure 5A:
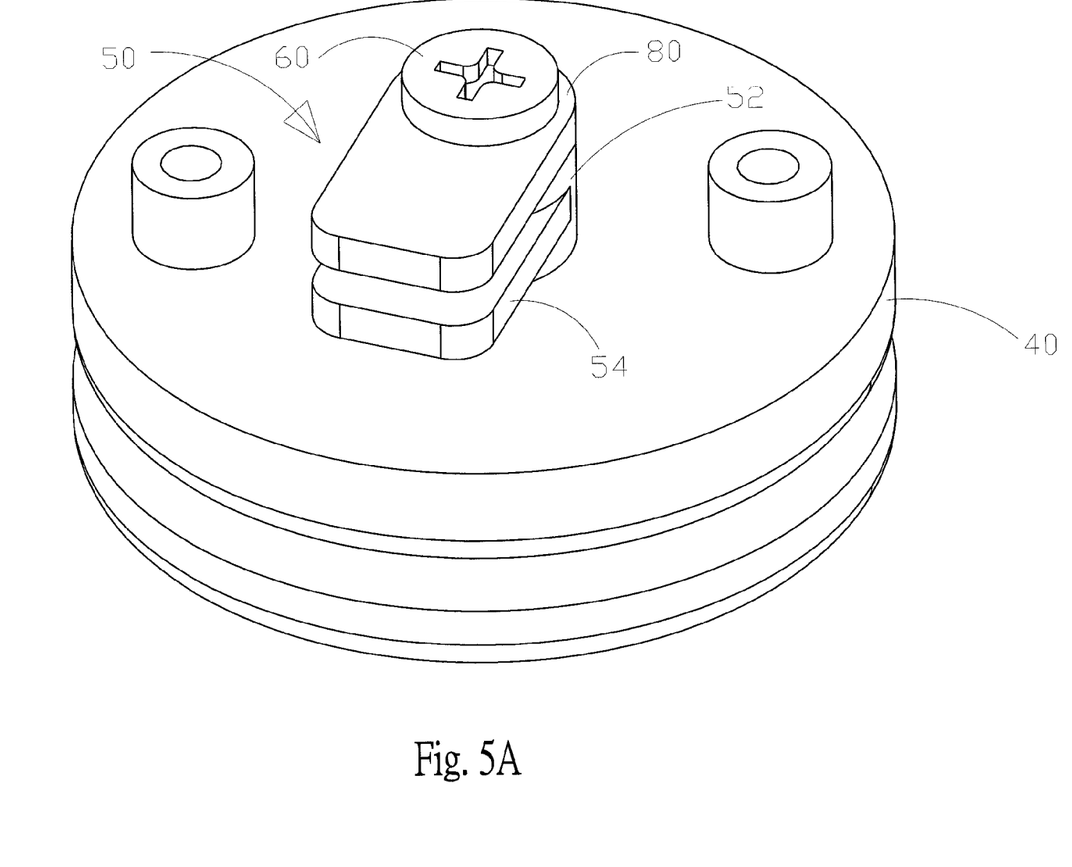
FIG. 5A is a perspective view of a further embodiment of a pad for portable electronics according to the present invention.
Figure 5B:
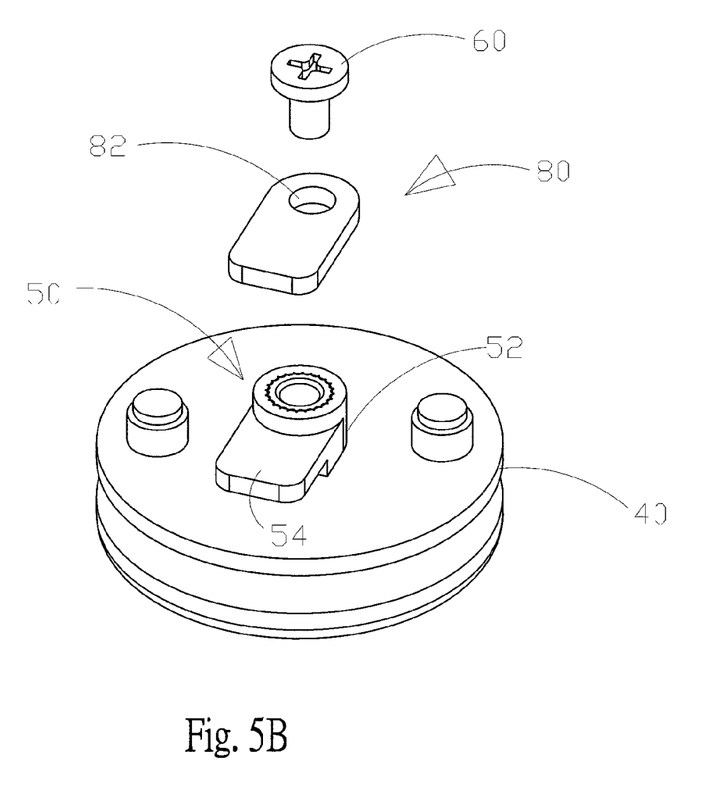
FIG. 5B is an explosive view of a further embodiment of a pad for portable electronics according to the present invention.

Refer from FIG. 5A to FIG. 5C, a further embodiment of the present invention is revealed. The difference between this embodiment and the above one is in that this embodiment further includes a holding plate 80 that is disposed above the connection part 52. The holding plate 80 has the same shape with the clipping part 54. A fixing hole 82 is arranged at the holding plate 80 and the locking element 60 penetrates the fixing hole 82. Thus there is a certain distance between the holding plate 80 and the clipping part 54. In this embodiment, the distance between the holding plate 80 and the clipping part 54 is the same with that between the clipping part 54 and the upper fastener 40. Thus user can mount the housing 10 between the clipping part and the upper fastener 40 so that the upper fastener 40 is attached to the housing 10 closely. Or the user can mount the housing 10 between the holding plate 80 and the clipping part 54 so as to leave a certain distance between the upper fastener 40 and the housing 10. Thus users can choose to set the pad at a preset height and the convenience of use of the pad/or the portable electronic is improved. Moreover, there is only one holding plate 80 in this embodiment. In practical use, a plurality of holding plates 80 are arranged at an interval according to users' requirements and a longer locking element 60 is used to insert through the plurality of holding plates 80.

Figure 6:
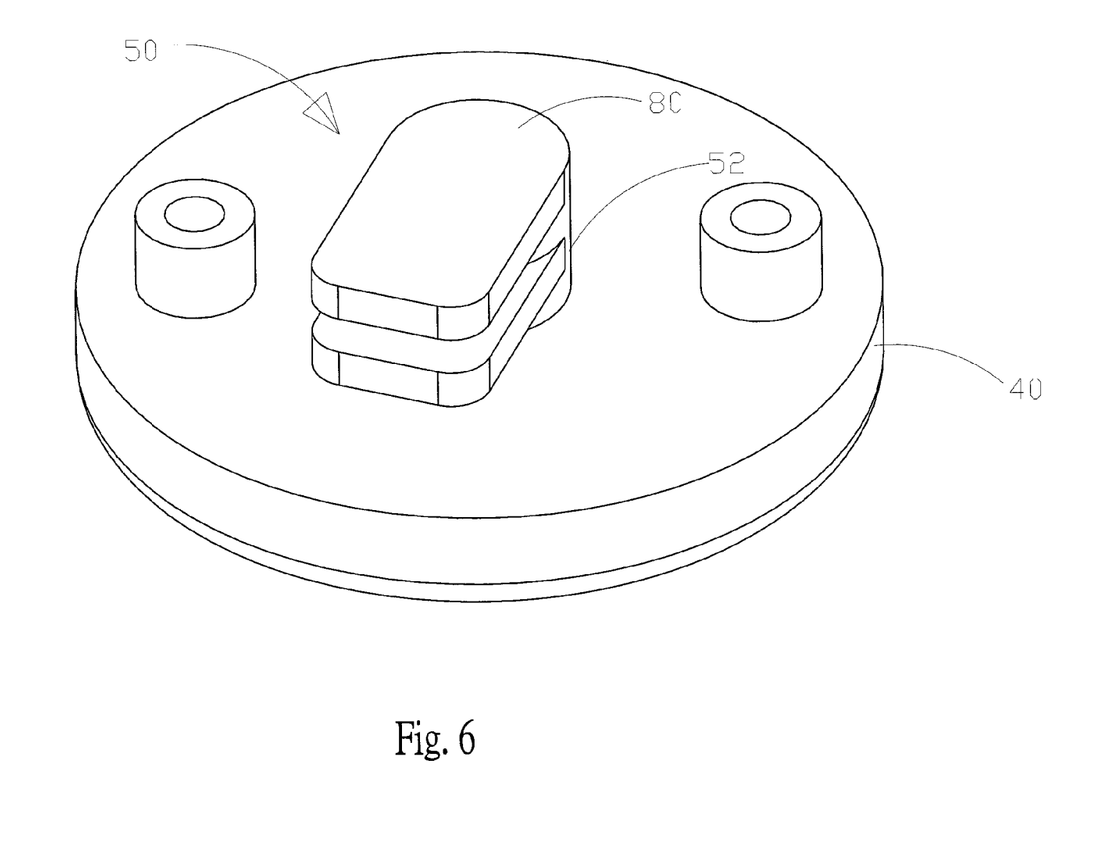
FIG. 6 is a perspective view of an upper fastener of an embodiment according to the present invention.

In addition, refer to FIG. 6, a perspective view of an upper fastener on a further embodiment of a pad for portable electronics according to the present invention is shown. The difference between this embodiment and above one is in that the holding plate 80 and the connection part 52 are integrated with each other. Moreover, the holding plate 80, the gripping member 50 and the upper fastener 40 are also integrated with one another. Thus there is no need to fasten the gripping member 50 or the holding plate 80. As a result, the convenience of use of the device is improved.

Figure 7:
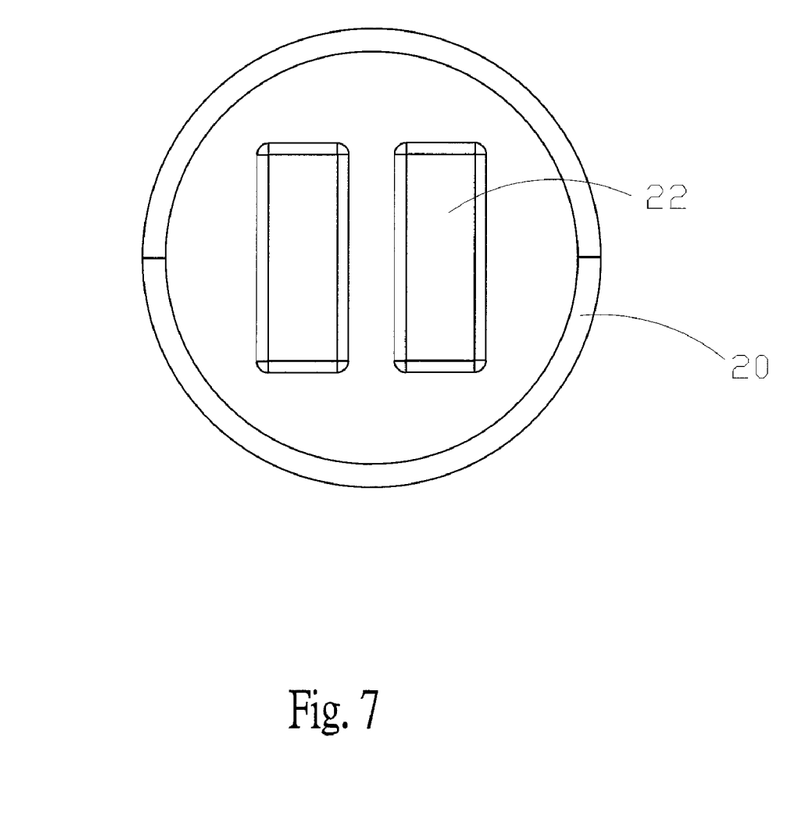
FIG. 7 is a bottom view of a lower fastener of an embodiment according to the present invention.

At last, refer to FIG. 7, a bottom view of a lower fastener of an embodiment according to the present invention is illustrated. At least one anti-slip member 22 is disposed under the lower fastener 20. The anti-slip member 22 is made of rubber and is able to be integrated with the lower fastener 20. The rubber increases friction between the pad and the placement surface and further improves stability of the portable electronic set on the placement surface.

In summary, a pad for portable electronics according to the present invention is mounted on a housing of portable electronics. The pad is composed of a lower fastener, a buffer member arranged at the lower fastener, an upper fastener connected with the buffer member and mounted onto the housing, and at least one gripping member arranged at the upper fastener and clipping to a side wall of the housing. By the gripping member, the pad is disposed without the use of adhesives or thermal fusion. Moreover, by the buffer member, the height of the pad set is adjusted automatically. Thereby the convenience of use of the pad is enhanced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A pad for portable electronics that is mounted on a housing of portable electronics comprising:
    a lower fastener,
    at least one buffer member arranged above the lower fastener,
    an upper fastener connected with the buffer member and mounted onto the housing; and
    at least one gripping member disposed above the upper fastener; the housing is arranged with an insertion hole and the gripping member penetrates the insertion hole and clips to a side wall of the housing.

2. The device as claimed in claim 1, wherein the buffer member includes a spring whose two ends are respectively disposed under the upper fastener and above the lower fastener.

3. The device as claimed in claim 2, wherein the buffer member includes a fixing bar that is inserted in the upper fastener and fixed on the lower fastener while the spring is disposed around the fixing bar and located between the upper fastener and the lower fastener.

4. The device as claimed in claim 3, wherein the upper fastener is arranged with a hole and the fixing bar inserts into the hole while the fixing bar is disposed with a stopper that is located over the upper fastener.

5. The device as claimed in claim 4, wherein the upper fastener is arranged with at least one stopper thereabove and the hole penetrates the stopper.

6. The device as claimed in claim 1, wherein the upper fastener is arranged with at least one stopper thereabove while the housing is disposed with a stop slot and the stopper is mounted into the stop slot.

7. The device as claimed in claim 1, wherein the gripping member having
    a connection part that is disposed on the upper fastener; and
    a clipping part that is arranged at one side of the connection part.

8. The device as claimed in claim 7, wherein the connection part and the upper fastener are integrated with each other.

9. The device as claimed in claim 7, wherein the pad for portable electronics further includes a locking element and the connection part is arranged with a locking hole while the locking element is mounted in the locking hole and is fixed on the upper fastener.

10. The device as claimed in claim 9, wherein the pad for portable electronics further includes a locking seat arranged in the locking hole and the locking element is mounted into the locking seat.

11. The device as claimed in claim 10, wherein the gripping member further includes a holding plate that is disposed above the connection part and having a fixing hole while the locking element penetrates the fixing hole.

12. The device as claimed in claim 7, wherein the gripping member further includes a holding plate that is disposed above the connection part.

13. The device as claimed in claim 12, wherein the holding plate and the connection part are integrated with each other.

14. The device as claimed in claim 1, wherein a receiving slot is disposed on the housing and the insertion hole is arranged inside the receiving slot; the upper fastener is mounted in the receiving slot.

15. The device as claimed in claim 1, wherein at least one anti-slip member is disposed under the lower fastener.

16. The device as claimed in claim 15, wherein the anti-slip member is made of rubber.

17. The device as claimed in claim 1, wherein the lower fastener is made of rubber.

* * * * *